(12) United States Patent
Kim

(10) Patent No.: US 12,376,467 B2
(45) Date of Patent: Jul. 29, 2025

(54) DISPLAY DEVICE

(71) Applicant: LG Display Co., Ltd., Seoul (KR)

(72) Inventor: Taehan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/532,847

(22) Filed: Dec. 7, 2023

(65) Prior Publication Data

US 2024/0107821 A1     Mar. 28, 2024

Related U.S. Application Data

(60) Continuation of application No. 17/849,418, filed on Jun. 24, 2022, now Pat. No. 11,882,732, which is a
(Continued)

(30) Foreign Application Priority Data

Aug. 24, 2018    (KR) ................. 10-2018-0099448

(51) Int. Cl.
*H10K 59/123*     (2023.01)
*H10K 50/81*     (2023.01)
(Continued)

(52) U.S. Cl.
CPC .......... *H10K 59/123* (2023.02); *H10K 50/81* (2023.02); *H10K 50/82* (2023.02); *H10K 50/84* (2023.02); *H10K 59/131* (2023.02)

(58) Field of Classification Search
CPC ............. H01L 27/3248; H01L 27/3276; H01L 51/5206; H01L 51/5221; H01L 51/5237; H01L 27/3246; H01L 27/3258; H01L 27/3262; H01L 27/3213; H01L 51/52; H01L 51/50–56; H01L 2251/50–568; H10K 59/123; H10K 50/81; H10K 50/82; H10K 50/84; H10K 59/131; H10K 71/861;
(Continued)

(56) References Cited

U.S. PATENT DOCUMENTS 9,693,463 B2    6/2017   Heo
10,276,078 B2    4/2019   Lee et al.
(Continued)

FOREIGN PATENT DOCUMENTS

CN     102760750 A    10/2012
CN     105741734 A    7/2016
(Continued)

OTHER PUBLICATIONS

United States Office Action, U.S. Appl. No. 17/849,418, filed May 10, 2023, nine pages.
(Continued)

*Primary Examiner* — Shahed Ahmed
(74) *Attorney, Agent, or Firm* — Fenwick & West LLP

(57) ABSTRACT

A display device includes a plurality of subpixels each including a transmission portion and a light emitting portion on a substrate, wherein the light emitting portion includes a driving transistor and an organic light emitting diode connected to the driving transistor, and an extension line extending from a drain electrode of the driving transistor and a first electrode of the organic light emitting diode are connected to each other in the transmission portion.

18 Claims, 7 Drawing Sheets

Related U.S. Application Data continuation of application No. 17/066,376, filed on Oct. 8, 2020, now Pat. No. 11,404,506, which is a division of application No. 16/548,698, filed on Aug. 22, 2019, now Pat. No. 10,833,141.

(51) Int. Cl.
  *H10K 50/82* (2023.01)
  *H10K 50/84* (2023.01)
  *H10K 59/131* (2023.01)

(58) Field of Classification Search
  CPC ............ H10K 59/1213; H10K 59/124; H10K 59/122; H10K 50/80; H10K 59/351; H10K 59/10–221; H10K 50/00–88; H10K 59/00–95; H10K 59/35–353; G09G 2330/00–028

See application file for complete search history.

(56) References Cited

U.S. PATENT DOCUMENTS

| | | | |
|---|---|---|---|
| 10,461,283 B2 | 10/2019 | Lee et al. | |
| 10,741,615 B2 | 8/2020 | Cho et al. | |
| 2006/0043510 A1* | 3/2006 | Yamazaki | H01L 27/124 257/E27.111 |
| 2014/0042419 A1* | 2/2014 | Okumoto | H10K 10/46 257/40 |
| 2014/0159026 A1* | 6/2014 | Okumoto | H10K 85/141 257/40 |
| 2014/0346475 A1 | 11/2014 | Cho et al. | |
| 2016/0064421 A1 | 3/2016 | Oh et al. | |
| 2016/0095210 A1 | 3/2016 | Heo | |
| 2016/0189593 A1 | 6/2016 | Lee et al. | |
| 2017/0069696 A1* | 3/2017 | Kondo | H10K 59/123 |
| 2017/0125507 A1 | 5/2017 | Lee et al. | |
| 2017/0133620 A1 | 5/2017 | Lee et al. | |
| 2017/0170206 A1* | 6/2017 | Lee | H10K 77/111 |
| 2017/0358637 A1* | 12/2017 | Lee | H10K 59/1213 |
| 2018/0061908 A1 | 3/2018 | Shim et al. | |
| 2018/0089485 A1* | 3/2018 | Bok | G06F 3/0412 |
| 2018/0190730 A1 | 7/2018 | Cho et al. | |
| 2019/0206300 A1 | 7/2019 | Lee et al. | |

FOREIGN PATENT DOCUMENTS

| | | |
|---|---|---|
| CN | 108269944 A | 7/2018 |
| KR | 10-2016-0037502 A | 4/2016 |

OTHER PUBLICATIONS

China National Intellectual Property Administration, Office Action, Chinese Patent Application No. 201910783569.2, Dec. 27, 2023, 19 pages.

* cited by examiner

DISPLAY DEVICE

This application is a continuation application of U.S. patent application Ser. No. 17/849,418, filed on Jun. 24, 2022, which is a continuation application of U.S. patent application Ser. No. 17/066,376 filed on Oct. 8, 2020, which is a divisional application of U.S. patent application Ser. No. 16/548,698 filed on Aug. 22, 2019, which claims the priority benefit of Republic of Korea Patent Application No. 10-2018-0099448 filed on Aug. 24, 2018, all of which are incorporated herein by reference for all purposes as if fully set forth herein.

BACKGROUND

Field of the Disclosure

The present disclosure relates to a display device and, more particularly, to a display device having an enhanced aperture ratio.

Related Art

As the information society has developed, demand for display devices for displaying images has increased in various forms. The display field has rapidly changed to thin, light, and large flat panel display devices (FPD) which replace bulky cathode ray tubes (CRTs). The flat panel display devices include a liquid crystal display (LCD), a plasma display panel (PDP), an organic light emitting display, and an electrophoretic display device (ED).

Among the display devices, the organic light emitting display device is a self-luminous device having a high response speed, high luminous efficiency and brightness, and a wide viewing angle. In particular, the organic light emitting display device may be formed on a flexible substrate, may be driven at a lower voltage than a plasma display panel or an inorganic electroluminescence (EL) display, and may consume less power, and has excellent color sensitivity.

Recently, a transparent display device in which a rear surface is visible from a front surface has been developed. For example, a transparent organic light emitting display device includes a pixel area in which a light emitting portion emits light and a transmission portion allows external light to be transmitted therethrough, thus implementing a transparent display device. Here, in the pixel area, the light emitting portion and the transmission portion are in a trade-off relationship that an increase in the light emitting portion decreases the transmission portion and an increase in the transmission portion decreases the light emitting portion, resulting in difficulty in increasing an aspect ratio of the light emitting portion. Therefore, research has been continued to increase the aperture ratio of the light emitting portion without reducing the transmission portion in the transparent display device.

SUMMARY

The present disclosure provides a display device capable of improving an aperture ratio of the light emitting portion, while preventing loss of a transmission portion as much as possible.

In an aspect, a display device includes a plurality of subpixels each including a transmission portion and a light emitting portion on a substrate, wherein the light emitting portion includes a driving transistor and an organic light emitting diode connected to the driving transistor, and an extension line extending from a drain electrode of the driving transistor and a first electrode of the organic light emitting diode are connected to each other in the transmission portion.

The plurality of subpixels may be demarcated as a gate line, a data line, a sensing line, a power supply line, and a cathode power supply line intersect each other, and each of the plurality of subpixels may further include a switching transistor, a sensing transistor, and a capacitor.

The light emitting portion may include a first light emitting portion overlapping the driving transistor and a second light emitting portion overlapping the sensing transistor and the switching transistor.

The extension line may intersect the data line across a portion between the first light emitting portion and the second light emitting portion.

The first electrode may include a first anode electrode located in the first light emitting portion and a second anode electrode located in the second light emitting portion.

The first anode electrode and the second anode electrode may extend to the transmission portion so as to be integrally connected to each other, and the first anode electrode and the second anode electrode may be connected to each other to form a first repair portion.

The extension line may be in contact with the first anode electrode and the second anode electrode in the first repair portion.

The display device may further include: a repair line extending from one side of the power supply line in parallel to the power supply line to a neighboring subpixel; a first connection pattern in contact with the repair line; and a second repair portion including the first anode electrode overlapping the first connection pattern.

The display device may further include a cathode contact portion in which the cathode power supply line and a second electrode of the organic light emitting diode overlap each other.

In another aspect, a display device includes a substrate including a light emitting portion and a transmission portion including a first repair portion; a thin film transistor located on the substrate and including at least a drain electrode, an extension line extending from the drain electrode, a passivation film located on the thin film transistor and the extension line and exposing the extension line; an overcoat layer located on the passivation layer, corresponding to the light emitting portion, and spaced apart from the first repair portion, a first electrode located on the overcoat layer, a bank layer located on the first electrode and exposing the first electrode, a light emitting layer located on the exposed first electrode and the bank layer, and a second electrode located on the light emitting layer, wherein the first electrode and the extension line are in contact with each other through a contact hole formed in the passivation film in the first repair portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF EMBODIMENTS

Figure 1:
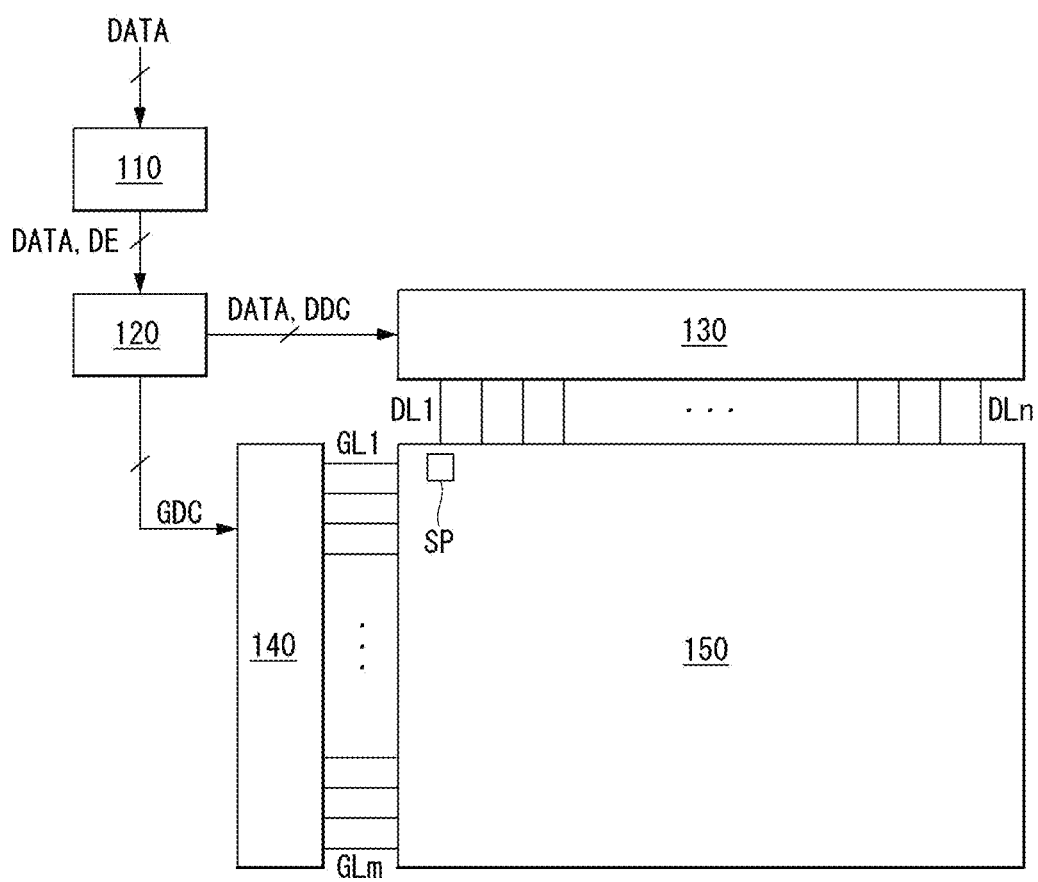
FIG. 1 is a schematic block diagram of an organic light emitting display device, according to one embodiment of the present disclosure.

Hereinafter, embodiments of the present disclosure will be described in detail with reference to the accompanying drawings. Throughout the specification, the like reference numerals denote the substantially same elements. In the following description, when a detailed description of the relevant known function or configuration is determined to unnecessarily obscure an important point of the present invention, the detailed description will be omitted. Names of elements used in the following description are selected for the description purpose and may be different from those of actual products.

As display device according to the present disclosure, an organic light emitting display device, a liquid crystal display device, and an electrophoretic display device, and the like, may be used, but in the present disclosure, the organic light emitting display device will be described as an example. The organic light emitting display device includes a first electrode as an anode, a second electrode as a cathode, and an organic layer formed of an organic material positioned between the first electrode and the second electrode. Thus, the organic light emitting display device is a self-luminous device in which holes supplied from the first electrode and electrons supplied from the second electrode are combined in the organic layer to form excitons, which are hole-electron pairs, and light is emitted by an energy generated as the excitons return to a ground state.

Figure 2:
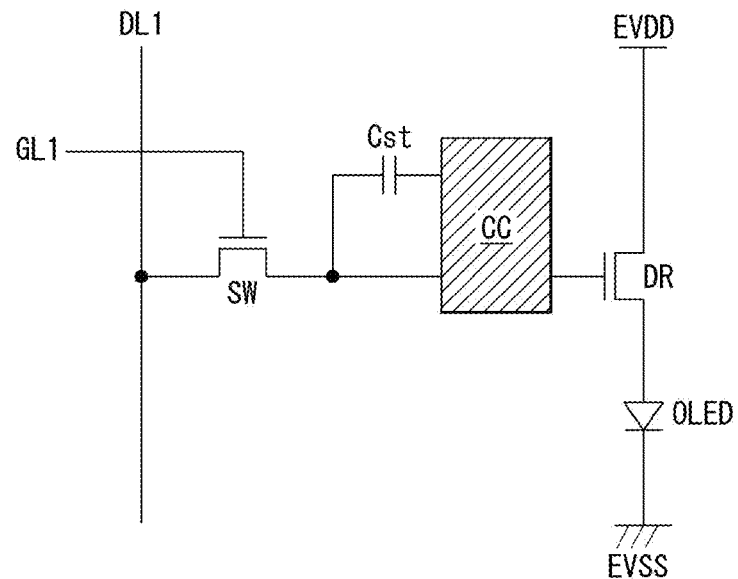
FIG. 2 is a schematic circuit diagram of a subpixel, according to one embodiment of the present disclosure.
Figure 3:
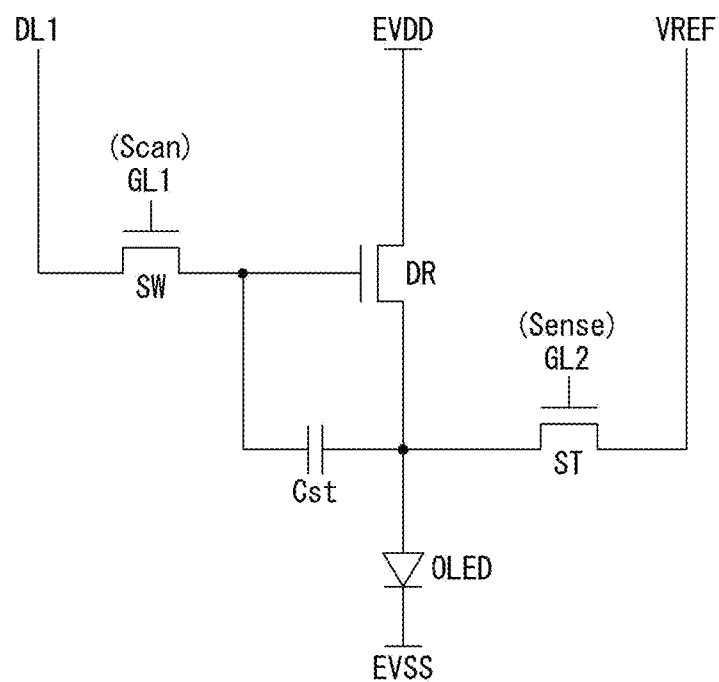
FIG. 3 is a view illustrating an example of a specific circuit configuration of a subpixel, according to an embodiment of the present disclosure.

FIG. 1 is a schematic block diagram of an organic light emitting display device, FIG. 2 is a schematic circuit diagram of a subpixel, and FIG. 3 is a view illustrating a specific circuit configuration of a subpixel, according to an embodiment of the present disclosure.

As illustrated in FIG. 1, the organic light emitting display device includes an image processor 110, a timing controller 120, a data driver 130, a scan driver 140, and a display panel 150.

The image processor 110 outputs a data enable signal DE together with a data signal DATA supplied from the outside. The image processor 110 may output at least one of a vertical synchronization signal, a horizontal synchronization signal, and a clock signal in addition to the data enable signal DE, but these signals are omitted for convenience of explanation.

The timing controller 120 is supplied with the data signal DATA in addition to driving signals including the data enable signal DE or the vertical synchronization signal, the horizontal synchronization signal, and the clock signal from the image processor 110. The timing controller 120 outputs a gate timing control signal GDC for controlling an operation timing of the scan driver 140 and a data timing control signal DDC for controlling an operation timing of the data driver 130.

In response to the timing control signal DDC supplied from the timing controller 120, the data driver 130 samples and latches the data signal DATA supplied from the timing controller 120 and converts the sampled data signal into a gamma reference voltage and outputs the same. The data driver 130 outputs the data signal DATA through data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal through the gate lines GL1 to GLm. The scan driver 140 is formed as an IC or a gate-in-panel (GIP) in the display panel 150.

The display panel 150 displays an image corresponding to the data signal DATA and the scan signal supplied from the data driver 130 and the scan driver 140. The display panel 150 includes subpixels SP that operate to display an image.

The subpixels SP include a red subpixel, a green subpixel, and a blue subpixel or a white subpixel, a red subpixel, a green subpixel, and a blue subpixel. The subpixels SP may have one or more different emission areas depending on the emission characteristics.

As illustrated in FIG. 2, a subpixel includes a switching transistor SW, a driving transistor DR, a capacitor Cst, a compensation circuit CC, and an organic light emitting diode OLED.

The switching transistor SW performs a switching operation so that a data signal supplied through a data line DL is stored as a data voltage in the capacitor Cst in response to a scan signal supplied through a first gate line GL1. The driving transistor DR operates so that a driving current flows between a power supply line EVDD (high potential voltage) and a cathode power supply line EVSS (low potential voltage) according to the data voltage stored in the capacitor Cst. The organic light emitting diode OLED operates to emit light according to the driving current generated by the driving transistor DR.

The compensation circuit CC is a circuit added in the subpixel to compensate for a threshold voltage of the driving transistor DR, and the like. The compensation circuit CC includes one or more transistors. A configuration of the compensation circuit CC varies according to external compensation methods and an example thereof will be described as follows.

As illustrated in FIG. 3, the compensation circuit CC includes a sensing transistor ST and a sensing line VREF (or a reference line). The sensing transistor ST is connected between a source electrode of the driving transistor DR and an anode electrode (hereinafter, referred to as a sensing node) of the organic light emitting diode OLED. The sensing transistor ST operates to supply an initialization voltage (or sensing voltage) transmitted through the sensing line VREF to the sensing node of the driving transistor DR or to sense a voltage or a current of the sensing node VREF or the sensing line VREF.

A source electrode or a drain electrode of the switching transistor SW is connected to the data line DL and the other one of the source electrode and the drain electrode is connected to a gate electrode of the driving transistor DR. A source electrode or a drain electrode of the driving transistor DR is connected to the power supply line EVDD and the other of the source electrode and the drain electrode is connected to the first electrode, which is an anode, of the organic light emitting diode OLED. A lower electrode of the capacitor Cst is connected to the gate electrode of the driving transistor DR and an upper electrode thereof is connected to the anode electrode of the organic light emitting diode OLED. A first electrode of the organic light emitting diode OLED is connected to the other of the source or drain electrode of the driving transistor DR and a second electrode thereof, which is a cathode electrode, is connected to the second power supply line EVSS. A source electrode or a drain electrode of the sensing transistor ST is connected to the sensing line VREF and the other of the source electrode or the drain electrode thereof is connected to the other of the source and drain electrodes of the driving transistor DR and the first electrode of the organic light emitting diode (OLED) which is a sensing node.

An operation time of the sensing transistor ST may be similar to or the same as that of the switching transistor SW according to an external compensation algorithm (or a configuration of a compensation circuit). For example, the gate electrode of the switching transistor SW may be connected to the first gate line GL1, and the gate electrode of the sensing transistor ST may be connected to the second gate line GL2. In this case, a scan signal Scan is transmitted to the first gate line GL1 and a sensing signal Sense is transmitted to the second gate line GL2. In another example, the first gate line GL1 connected to the gate electrode of the switching transistor SW and the second gate line GL2 connected to the gate electrode of the sensing transistor ST may be connected so as to be shared in common.

The sensing line VREF may be connected to the data driver. In this case, the data driver may sense the sensing node of the subpixel in real time or during a non-display period of an image or an N frame (N is an integer of 1 or greater) and generate a sensing result. Meanwhile, the switching transistor SW and the sensing transistor ST may be turned on at the same time. In this case, a sensing operation through the sensing line VREF and a data output operation of outputting a data signal are separated (distinguished) from each other based on time division multiplexing (TDM) of the data driver.

In addition, a compensation target according to the sensing result may be a digital data signal, an analog data signal, gamma, or the like. A compensation circuit for generating a compensation signal (or compensation voltage) based on the sensing result may be implemented in the data driver, in the timing controller, or as a separate circuit.

In FIG. 3, the subpixel having a 3T (transistor) 1C (capacitor) structure including the switching transistor SW, the driving transistor DR, the capacitor Cst, the organic light emitting diode OLED, and the sensing transistor ST has been described as an example, but it may also be configured as 3T2C, 4T2C, 5T1C, 6T2C, etc, when a compensation circuit CC is added.

Figure 4:
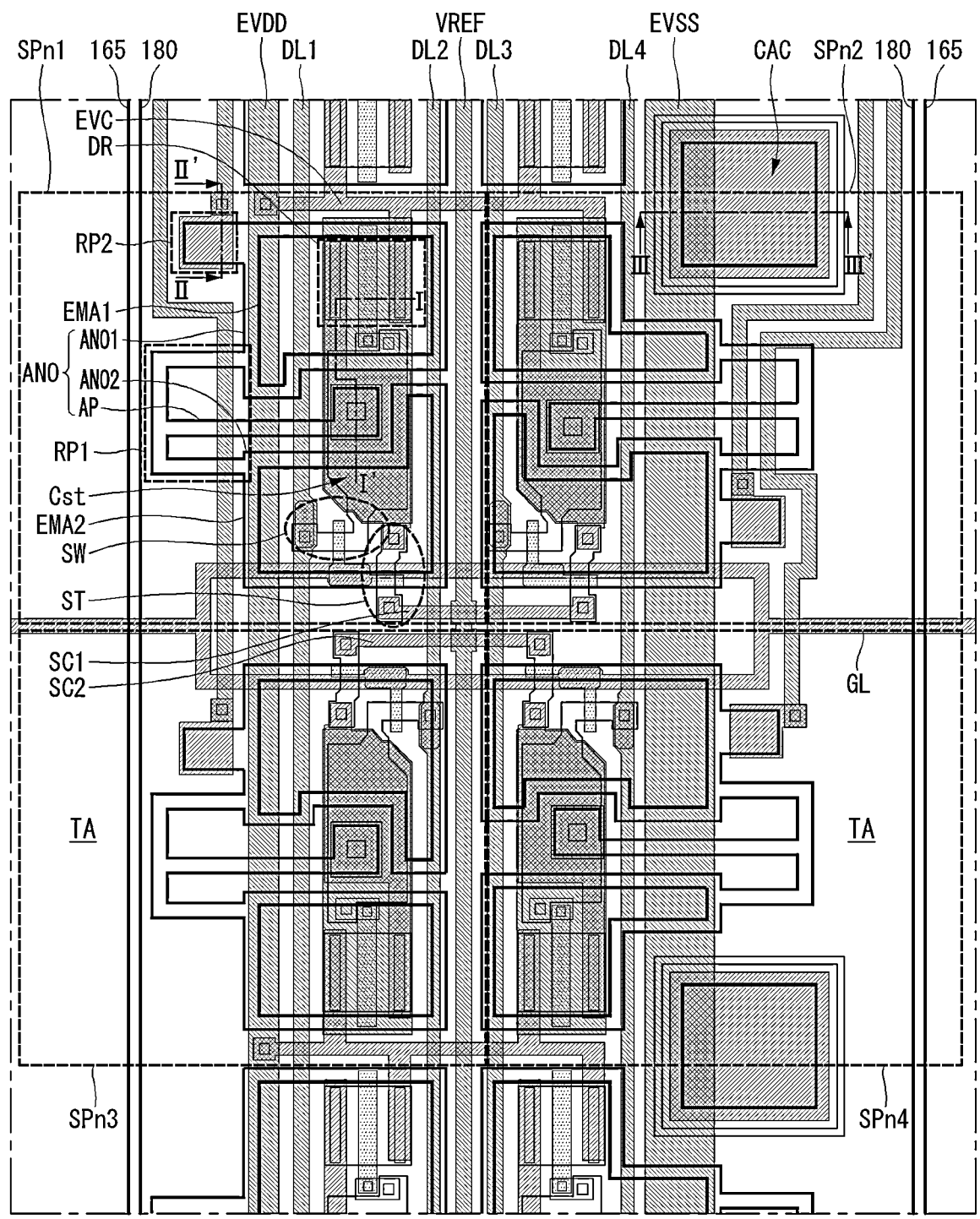
FIG. 4 is a plan view of an organic light emitting display device according to a first embodiment of the present disclosure.
Figure 5:
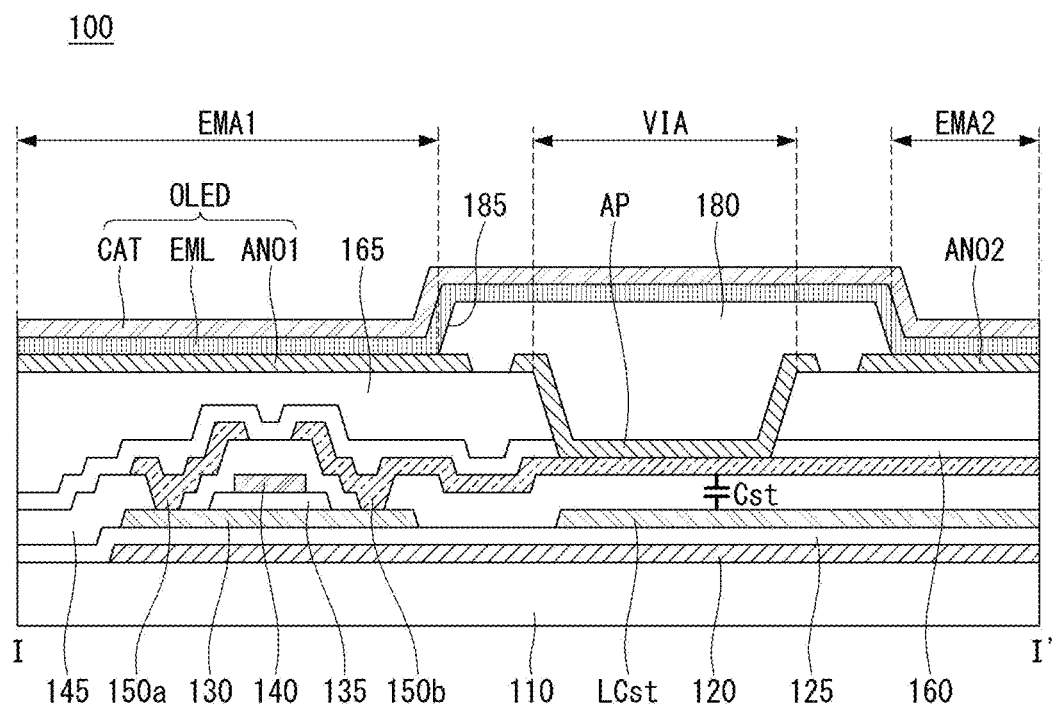
FIG. 5 is a cross-sectional view taken along line I-I' of FIG. 4, according to an embodiment of the present disclosure.
Figure 6:
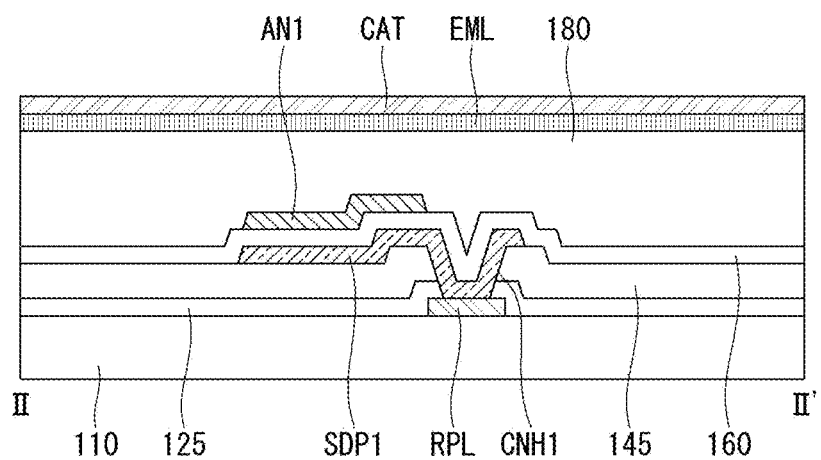
FIG. 6 is a cross-sectional view taken along line II-II' of FIG. 4, according to an embodiment of the present disclosure.
Figure 7:
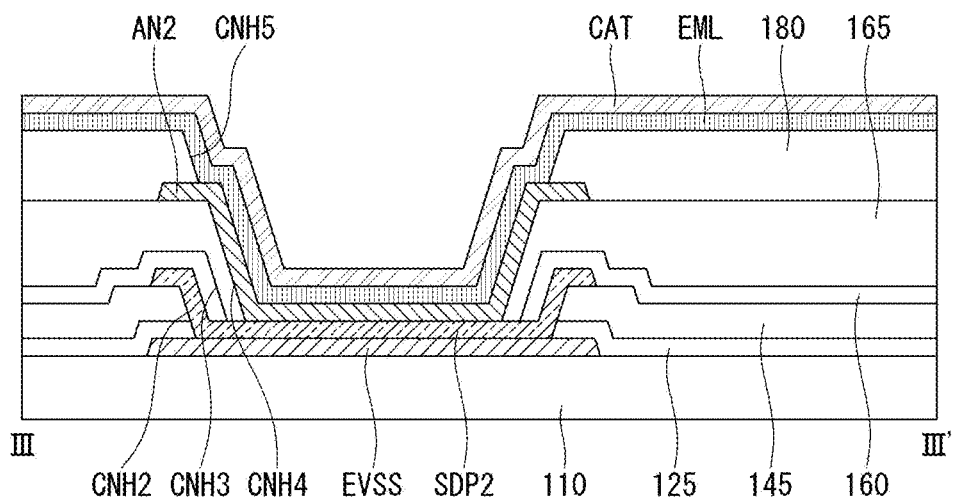
FIG. 7 is a cross-sectional view taken along line III-III' of FIG. 4, according to an embodiment of the present disclosure.

FIG. 4 is a plan view of an organic light emitting display device according to a first embodiment of the present disclosure, FIG. 5 is a cross-sectional view taken along line I-I' of FIG. 4, FIG. 6 is a cross-sectional view taken along line II-IP of FIG. 4, and FIG. 7 is a cross-sectional view taken along line III-III' of FIG. 4, according to an embodiment of the present disclosure.

Referring to FIG. 4, in the organic light emitting display device of the present disclosure, the gate line GL and first to fourth data lines DL1 to DL4 intersect to define first to fourth subpixels SPn1 to SPn4. The first to fourth subpixels SPn1 to SPn4 include first and second emission areas EMA1 and EMA2 and a transmission area TA.

Specifically, the first to fourth subpixels SPn1 to SPn4 connected to the first to fourth data lines DL1 to DL4 are connected in common to the sensing line VREF. The first subpixel SPn1 and the third subpixel SPn3 are connected to the sensing line VREF through a first sensing connection line SC1 and the second subpixel SPn2 and the fourth subpixel SPn4 are connected to the sensing line VREF through the second sensing connection line SC2. The power supply line EVDD is disposed on one side of the first subpixel SPn1 and the second subpixel SPn2, and the first to fourth subpixels SPn1 to SPn4 are connected to the power supply line EVDD through a power supply connection line EVC. The cathode power supply line EVSS is disposed on one side of the third and fourth subpixels SPn3 and SPn4 and connected to a second electrode (not shown) which is a cathode.

A first anode electrode ANO1 is disposed at a first light emitting portion EMA1 of each subpixel and a second anode electrode ANO2 is arranged at a second light emitting portion EMA2 so that a first electrode ANO is disposed. The first anode electrode ANO1 and the second anode electrode ANO2 are connected to each other to form the first electrode ANO. A driving transistor DR, a capacitor Cst, a sensing transistor ST, and a switching transistor SW are disposed in each subpixel. The first light emitting portion EMA1 overlaps the driving transistor DR and the second light emitting portion EMA2 overlaps the sensing transistor ST and the switching transistor SW.

The sensing line VREF is connected to each of the sensing transistors ST of the first to fourth subpixels SPn1 to SPn4 through the first and second sensing connection lines SC1 and SC2. The power supply line EVDD is connected to each of the driving transistors DR of the first and second subpixels SPn1 and SPn2 through the power supply connection line EVC. The power supply connection line EVC is connected to each of the four subpixels. The gate lines GL are connected to the respective sensing and switching transistors ST and SW of the first to fourth subpixels SPn1 to SPn4.

The first electrode ANO includes a first anode electrode ANO1, a second anode electrode ANO2, and an anode connection electrode AP. The anode connection electrode AP is connected to the driving transistor DR and branches to the first anode electrode ANO1 and the second anode electrode ANO2. The first anode electrode ANO1, the second anode electrode ANO2, and the anode connection electrode AP are formed of one body.

A first repair portion RP1 is disposed in a region where the first anode electrode ANO1 and the second anode electrode ANO2 of the first electrode ANO are connected to each other. When the one light emitting portion malfunctions due to a foreign object, or the like, which may occur during a process, the first repair portion RP1 may cut the first anode electrode ANO1 of the first light emitting portion EMA1 or the second anode electrode ANO2 of the second light emitting portion EMA2 to repair the subpixel.

A second repair portion RP2 is disposed at the first anode electrode ANO1 or the second anode electrode ANO2. When any one of the light emitting portions of the subpixel malfunctions due to a foreign object, or the like, which may occur during the process, the second repair portion RP2 may cut the first anode electrode ANO1 or the second anode electrode ANO2 of the first repair portion RP1 and connect the cut anode electrode to the first electrode (anode electrode) of another subpixel adjacent thereto to repair it. A repair line RPL is disposed at the second repair portion RP2 and extends from one side of the power supply line EVDD in parallel to the power supply line EVDD to a neighbor subpixel.

As described above, the first electrode ANO branches to the first anode electrode ANO1 of the first light emitting portion EMA1 and the second anode electrode ANO2 of the second light emitting portion EMA2 to have the first repair portion RP1. Hereinafter, a connection relationship of the first electrode ANO will be described.

Referring to FIG. 5, a cross-sectional structure of the first subpixel SPn1 will be representatively described, according to an embodiment of the present disclosure. The organic light emitting display device according to the embodiment of the present disclosure includes a light shielding layer 120 disposed on a substrate 110. The light shielding layer 120 serves to shield ambient light from entering to prevent generation of an optical current in a thin film transistor (TFT). A buffer layer 125 is located on the light shielding layer 120. The buffer layer 125 protects the TFT formed in a follow-up process from impurities such as alkali ions or the like, which are leaked from the light shielding layer 120. The buffer layer 125 may be a silicon oxide (SiOx), a silicon nitride (SiNx), or a multilayer thereof.

A semiconductor layer 130 of the driving transistor DR is located on the buffer layer 125 and a capacitor lower electrode LCst is located to be spaced apart from the semiconductor layer 130. The semiconductor layer 130 and the capacitor lower electrode LCst may be formed of a silicon semiconductor or an oxide semiconductor. The silicon semiconductor may include amorphous silicon or crystallized polycrystalline silicon. Here, the polycrystalline silicon has high mobility (100 cm$^2$/Vs or more), low energy consumption power, and excellent reliability, and may be applied to a gate driver for a driving element and/or a multiplexer (MUX). Meanwhile, since the oxide semiconductor has low OFF current, it is suitable for a switching TFT which has a short ON time and maintains a long OFF time. Further, since the OFF current is small, a voltage maintaining period of the pixel is long, which is suitable for a display device requiring low speed driving and/or low power consumption. In addition, the semiconductor layer 130 includes a source region and a drain region including a p-type or n-type impurity, and includes a channel therebetween. The capacitor lower electrode LCst is also doped with impurities to become conductive.

A gate insulating layer 135 is located on the semiconductor layer 130 and the capacitor lower electrode LCst. The gate insulating film 135 may be a silicon oxide (SiOx), a silicon nitride (SiNx), or a multilayer thereof. A gate electrode 140 is located on the gate insulating film 135 at a position corresponding to a predetermined region of the semiconductor layer 130, that is, at a position corresponding to a channel when impurities are injected. The gate electrode 140 may be formed of any one selected from the group consisting of molybdenum (Mo), aluminum (Al), chromium (Cr), gold (Au), titanium (Ti), nickel (Ni), neodymium (Nd), and copper (Cu) or an alloy thereof. The gate electrode 140 may be formed of any one selected from the group consisting of Mo, Al, Cr, Au, Ti, Ni, Ne, and Cu or an alloy thereof. For example, the gate electrode 140 may be a dual-layer of molybdenum/aluminum-neodymium or molybdenum/aluminum.

An interlayer insulating film 145 insulating the gate electrode 140 is located on the gate electrode 140. The interlayer insulating film 145 may be a silicon oxide film (SiOx), a silicon nitride film (SiNx), or a multilayer thereof. A source electrode 150a and a drain electrode 150b are located on the interlayer insulating film 145. The source electrode 150a and the drain electrode 150b are connected to the semiconductor layer 130 via a contact hole exposing the source region of the semiconductor layer 130. The source electrode 150a and the drain electrode 150b may be formed of a single layer or a multilayer. When the source electrode 150a and the drain electrode 150b are single layers, the source electrode 150a and the drain electrode 150b may be formed of molybdenum (Mo), aluminum (Al), chromium (Cr), gold (Au), titanium (Ti), nickel (Ni), neodymium (Nd), and copper (Cu), or an alloy thereof. When the source electrode 150a and the drain electrode 150b are multilayers, the source electrode 150a and the drain electrode 150b may be formed of a single layer may be formed of dual-layers of molybdenum/aluminum-neodymium or triple layers of titanium/aluminum/titanium, molybdenum/aluminum/molybdenum or molybdenum/aluminum-neodymium/molybdenum. Accordingly, the driving transistor DR including the semiconductor layer 130, the gate electrode 140, the source electrode 150a, and the drain electrode 150b is formed. In addition, the capacitor lower electrode LCst forms a capacitor Cst as the drain electrode 150b serves as a capacitor upper electrode.

A passivation film 160 is located on the substrate 110 including the driving transistor DR and the capacitor Cst. The passivation film 160, which is an insulating film for protecting an underlying element, may be a silicon oxide film (SiOx), a silicon nitride film (SiNx), or a multilayer thereof. An overcoat layer 165 is located on the passivation film 160. The overcoat layer 165 may be a planarizing film for alleviating a step of a lower structure and is formed of an organic material such as polyimide, benzocyclobutene series resin, or acrylate. The overcoat layer 165 may be formed by a method such as spin on glass (SOG) in which the organic material is coated in a liquid form and then cured. A via hole VIA exposing the passivation film 160 to expose the drain electrode 150b is formed at a partial region of the overcoat layer 165.

An organic light emitting diode (OLED) is located on the overcoat layer 165. More specifically, a first electrode ANO is located on the overcoat layer 165. The first electrode ANO acts as a pixel electrode and is connected to a drain electrode 150b of the driving transistor DR through an anode connection electrode AP connected to the first electrode ANO. The first electrode ANO, which is an anode, may be formed of a transparent conductive material such as indium tin oxide (ITO), indium zinc oxide (IZO), or zinc oxide (ZnO). The organic light emitting display device 100 of the present disclosure may have a top emission structure in which the first electrode ANO may be a reflective electrode. Therefore, the first electrode ANO further includes a reflective layer (not shown). The reflective layer may be formed of aluminum (Al), copper (Cu), silver (Ag), nickel (Ni) or an alloy thereof, and is preferably formed of APC (silver/palladium/copper alloy).

A bank layer 180 for partitioning a pixel is located on the substrate 110 including the first electrode ANO. The bank layer 180 is formed of an organic material such as polyimide, benzocyclobutene series resin, or acrylate. In the bank layer 180, a pixel defining portion 185 exposing the first electrode ANO is located. An organic light emitting layer EML in contact with the first electrode (ANO) is located on a front surface of the substrate 110. The organic light emitting layer EML, which is a layer in which electrons and holes are combined to emit light, may include a hole injection layer or a hole transport layer between the organic light emitting layer EML and the first electrode ANO and may include an electron transport layer or an electron injection layer on the organic layer EML.

A second electrode CAT is located on the organic light emitting layer EML. The second electrode CAT is located on a front surface of a display area A/A and may be formed of magnesium (Mg), calcium (Ca), aluminum (Al), silver (Ag), or an alloy thereof having a low work function as a cathode electrode. The second electrode CAT may be a transparent electrode and have a small thickness enough for light to be transmitted therethrough.

In the first subpixel SPn1 of the present disclosure, the drain electrode 150b of the driving transistor DR is connected to the first anode electrode ANO1 and the second anode electrode ANO2 through the anode connection electrode AP. Specifically, the anode connection electrode AP is connected to the drain electrode 150b through a via hole VIA formed in the passivation film 160 and the overcoat layer 165. The anode connection electrode AP connected to the drain electrode 150b of the driving transistor DR extends to the first repair portion RP1. As illustrated in FIG. 4, the anode connection electrode AP branches from the first repair portion RP1 to the first anode electrode ANO1 and the second anode electrode ANO2. In the first repair portion RP1, when one of the light emitting portions malfunctions due to a foreign object, or the like, which may occur during the process, the first anode electrode ANO1 or the second anode electrode ANO2 is cut to repair the light emitting portion.

In the meantime, the second repair portion RP2 connected to the first anode electrode ANO1 or the second anode electrode ANO2 is disposed. Hereinafter, the second repair portion RP2 connected to the first anode electrode ANO1 will be described as an example.

Referring to FIG. 6, a repair line RPL is located on a substrate 110 and the buffer layer 125 and an interlayer insulating layer 145 are located on the repair line RPL in the second repair portion RP2. The buffer layer 125 and the interlayer insulating layer 145 has a first contact hole CNH1 for exposing the underlying repair line RPL. A first connection pattern SDP1 in contact with the repair line RPL through the first contact hole CNH1 is located on the interlayer insulating film 145. The first connection pattern SDP1 is formed of the same material as the source electrode 150a. The passivation film 160 is positioned on the first connection pattern SDP1 and a first anode connection pattern AN1 overlapping the first connection pattern SDP1 is positioned on the passivation film 160. As illustrated in FIG. 4, the first anode connection pattern AN1 is formed integrally with the first anode electrode ANO1 of the first light emitting portion EMA1. The bank layer 180, the light emitting layer EML, and the second electrode CAT are sequentially stacked on the first anode connection pattern AN1.

In the second repair portion RP2, when any one light emitting portion of the subpixel malfunctions due to a foreign object, or the like, which may occur during the process, the first anode electrode ANO1 of the first repair portion RP1 may be cut and connected to another subpixel adjacent thereto to perform repairing. Specifically, when the passivation film 160 between the first connection pattern SDP1 and the first anode connection pattern AN1 is removed by irradiating a laser to the second repair portion RP2, the first connection pattern SDP1 the first anode connection patterns AN1 are in contact with each other so as to be electrically connected. Therefore, a voltage applied to the first electrode of the adjacent other subpixel (e.g., the lower subpixel of the third subpixel SPn3) may be applied to the first anode electrode ANO1 of the first light emitting portion EMA1 of the first subpixel SPn1, and thus, repairing may be performed.

Meanwhile, as illustrated in FIG. 4, the cathode power supply line EVSS for applying a low potential voltage to the second electrode CAT is disposed. The cathode power supply line EVSS is connected to the second electrode CAT overlapping the cathode power supply line EVSS in the cathode contact portion CAC.

Specifically, referring to FIG. 7, in the cathode contact portion CAC, the cathode power source line EVSS is located on the substrate 110 and the buffer layer 125 and the interlayer insulating layer 145 are located on the cathode power supply line EVSS. The buffer layer 125 and the interlayer insulating layer 145 have a second contact hole CNH2 exposing the underlying cathode power supply line EVSS. The second connection pattern SDP2 connected to the cathode power supply line EVSS through the second contact hole CNH2 is formed on the interlayer insulating film 145. The second connection pattern SDP2 is formed of the same material as the source electrode. The passivation film 160 is positioned on the second connection pattern SDP2 and the passivation film 160 has a third contact hole CNH3 for exposing the underlying second connection pattern SDP2. The overcoat layer 165 is positioned on the passivation film 160 and has a fourth contact hole CNH4 exposing the underlying second connection pattern SDP2. The second anode connection pattern AN2 is positioned on the overcoat layer 165 and connected to the second connection pattern SDP2 through the third and fourth contact holes CNH3 and CNH4. The bank layer 180 is located on the second anode connection pattern AN2 and has a fifth contact hole CNH5 exposing the underlying second anode connection pattern AN2. The light emitting layer EML and the second electrode CAT are sequentially stacked on the bank layer 180.

The cathode contact portion CAC serves to lower resistance, while applying a low potential voltage to the second electrode CAT. Therefore, in order to lower resistance of the second electrode CAT, a laser may be selectively irradiated to the cathode contact CAC to connect the second electrode CAT to the cathode power supply line EVSS. Specifically, when the cathode contact portion CAC is irradiated with a laser, the light emitting layer EML may be removed and the second electrode CAT and the second anode connection pattern AN2 may be brought into contact with each other to be electrically connected. Therefore, the second electrode CAT may be connected to the cathode power supply line EVSS through the second anode connection pattern AN2 to lower resistance of the second electrode CAT.

Referring to FIGS. 4 and 5, the area of the first light emitting portion EMA1 and the second light emitting portion EMA2 is reduced due to the margin of the via hole VIA disposed between the first light emitting portion EMA1 and the second light emitting portion EMA2.

Hereinafter, a second embodiment of the present disclosure in which the area of the first light emitting portion EMA1 and the second light emitting portion EMA2, i.e., an aperture ratio, is improved will be described.

Figure 8:
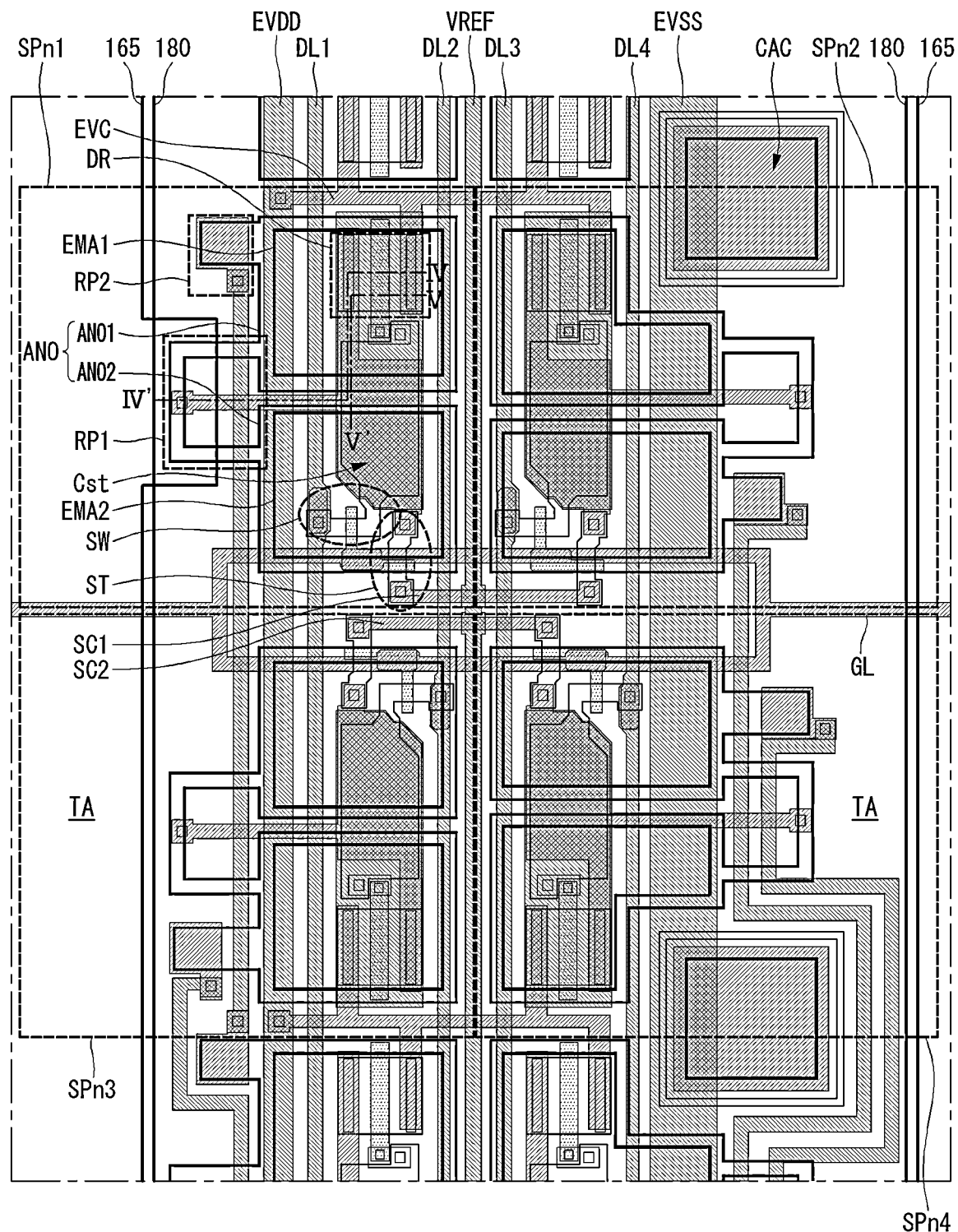
FIG. 8 is a plan view of an organic light emitting display device according to a second embodiment of the present disclosure.
Figure 9:
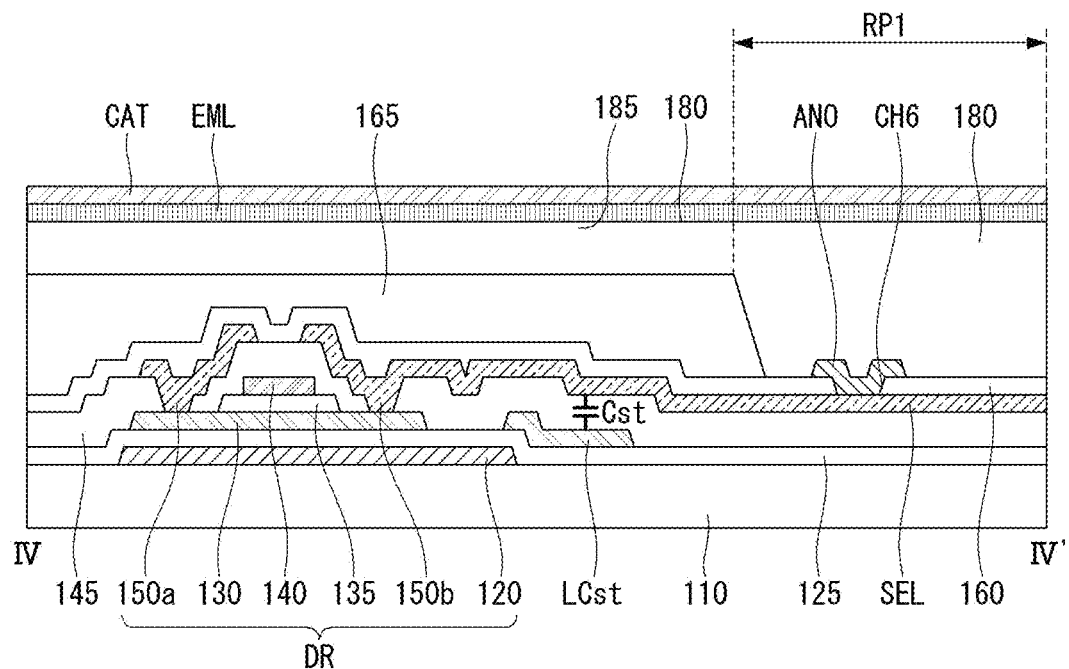
FIG. 9 is a cross-sectional view taken along line IV-IV' of FIG. 8, according to an embodiment of the present disclosure.
Figure 10:
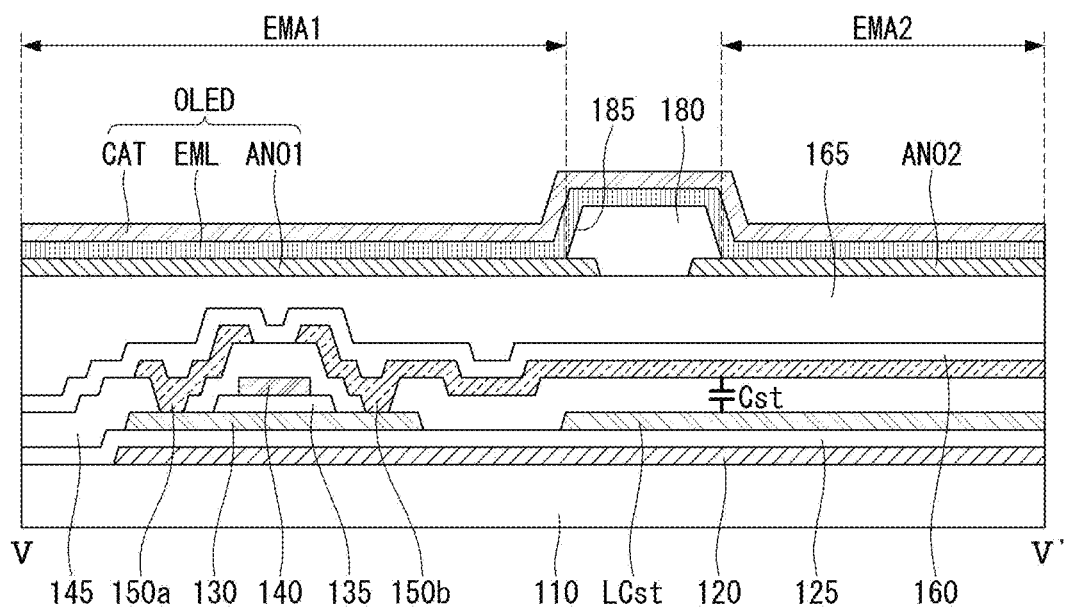
FIG. 10 is a cross-sectional view taken along line V-V' of FIG. 8, according to an embodiment of the present disclosure.

FIG. 8 is a plan view of an organic light emitting display device according to a second embodiment of the present disclosure, FIG. 9 is a cross-sectional view taken along line IV-IV' of FIG. 8, according to an embodiment of the present disclosure. And FIG. 10 is a cross-sectional view taken along line V-V' of FIG. 8, according to an embodiment of the present disclosure. In the following, the same components as those of the first embodiment described above will be briefly described.

Referring to FIG. 8, in the organic light emitting display device of the present disclosure, the gate line GL and first to fourth data lines DL1 to DL4 intersect to define first to fourth subpixels SPn1 to SPn4. The first to fourth subpixels SPn1 to SPn4 include first and second emission areas EMA1 and EMA2 and a transmission area TA.

Specifically, the first to fourth subpixels SPn1 to SPn4 connected to the first to fourth data lines DL1 to DL4 are connected in common to the sensing line VREF. The first subpixel SPn1 and the third subpixel SPn3 are connected to the sensing line VREF through a first sensing connection line SC1 and the second subpixel SPn2 and the fourth subpixel SPn4 are connected to the sensing line VREF through the second sensing connection line SC2. The power supply line EVDD is disposed on one side of the first subpixel SPn1 and the second subpixel SPn2, and the first to fourth subpixels SPn1 to SPn4 are connected to the power supply line EVDD through a power supply connection line EVC. The cathode power supply line EVSS is disposed on one side of the third and fourth subpixels SPn3 and SPn4 and connected to a second electrode (not shown) which is a cathode.

A first anode electrode ANO1 is disposed at the first light emitting portion EMA1 of each subpixel and a second anode electrode ANO2 is disposed at the second light emitting portion EMA2. A driving transistor DR, a capacitor Cst, a sensing transistor ST, and a switching transistor SW are disposed in each subpixel. The sensing line VREF is connected to each of the sensing transistors ST of the first to fourth subpixels SPn1 to SPn4 through the first and second sensing connection lines SC1 and SC2. The power supply line EVDD is connected to each of the driving transistors DR of the first and second subpixels SPn1 and SPn2 through the power supply connection line EVC. The gate lines GL are connected to the respective sensing and switching transistors ST and SW of the first to fourth subpixels SPn1 to SPn4.

The first electrode ANO includes the first anode electrode ANO1 and the second anode electrode ANO2. The first repair portion RP1 is disposed in a region branched from the first anode electrode ANO1 and the second anode electrode ANO2 and the second repair portion RP2 is disposed on one side of the first anode electrode ANO1. A portion extending from the semiconductor layer 130 forms the capacitor lower electrode LCst and a portion extending from the drain electrode 150b serves as a capacitor upper electrode to form the capacitor Cst. In particular, an extension line SEL protruding from a portion of the drain electrode 150b which is the capacitor upper electrode so as to intersect the power supply line EVDD is disposed. The extension line SEL extends from the drain electrode 150b which is the upper electrode of the capacitor to the first repair portion RP1 located in the transmission portion TA and is electrically connected to the first anode electrode ANO1 and the second anode electrode ANO2. The extension line SEL intersects the data line DL1 across a portion between the first light emitting portion EMA1 and the second light emitting portion EMA2.

Hereinafter, a specific connection relationship between the extension line SEL and the first electrode ANO will be described.

Referring to FIGS. 9 and 10, in the organic light emitting display device according to the second embodiment of the present disclosure, the light shielding layer 120 is located on the substrate 110 and the buffer layer 125 is located on the light shielding layer 120. The semiconductor layer 130 is located on the buffer layer 125 and the gate insulating layer 135 is located on the semiconductor layer 130. The gate electrode 140 is located on the gate insulating film 135 and the interlayer insulating film 145 is located on the gate electrode 140. The source electrode 150a and the drain electrode 150b are located on the interlayer insulating film 145. Accordingly, the driving transistor DR including the semiconductor layer 130, the gate electrode 140, the source electrode 150a, and the drain electrode 150b is formed. A portion extending from the semiconductor layer 130 forms the capacitor lower electrode LCst and a portion extending from the drain electrode 150b acts as a capacitor upper electrode to form the capacitor Cst.

The passivation film 160 is positioned on the substrate 110 including the driving transistor DR and the capacitor Cst. The passivation film 160 has a sixth contact hole CH6 exposing a portion of the extension line SEL. The sixth contact hole CH6 is disposed in the first repair portion RP1. The overcoat layer 165 is located on the passivation film 160. The overcoat layer 165 is not formed in the transmission portion TA as illustrated in FIG. 8 but is formed to expose the sixth contact hole CH6 of the first repair portion RP1. As described above with reference to FIG. 5, the contact hole is formed by wet etching in the overcoat layer 165 as an organic material, and thus, a size of the contact hole is inevitably increased. In the first embodiment of the present disclosure, the overcoat layer 165 may not be omitted between the light emitting portions. In contrast, in the second embodiment of the present disclosure, since the overcoat layer 165 is in contact with the first electrode ANO in the transmission portion TA through the extension line SEL, the overcoat layer 165 may be omitted in the transmission portion TA.

An organic light emitting diode (OLED) is positioned on the overcoat layer 165. More specifically, as illustrated in FIG. 9, the first electrode ANO is located on the passivation film 160 where the overcoat layer 165 is not formed. The first electrode ANO is formed on the passivation film 160 in the first repair portion RP1 and is in direct contact with the extension line SEL through the sixth contact hole CH6. The sixth contact hole CH6 of the passivation film 160 is formed through dry etching, and thus, a size of the sixth contact hole CH6 may be formed to be very small. Therefore, since the first electrode ANO is in direct contact with the extension line SEL through the sixth contact hole CH6, a contact area between the first electrode ANO and the extension line SEL may be significantly reduced.

As described above with reference to FIG. 4, the contact portion in which the first electrode ANO and the drain electrode 150b are in contact with each other must be connected via the via hole VIA of the overcoat layer 165. Since the via hole VIA is formed in the overcoat layer 165 which is an organic material by wet etching, a size of the via hole VIA is very large. Therefore, as illustrated in FIG. 5, the area of the first light emitting portion EMA1 and the second light emitting portion EMA2 is reduced by avoiding the via hole VIA.

Meanwhile, as illustrated in FIG. 8, the sixth contact hole CH6, which is in contact with the extension line SEL of the first electrode ANO and the drain electrode 150b, is formed in the first repair portion RP1, the area of the first light emitting portion EMA1 and the second light emitting portion EMA2 may be increased without substantially reducing the area of the transmission portion TA due to the small sixth contact hole CH6. Accordingly, as illustrated in FIG. 10, the second embodiment of the present disclosure has an advantage that the area of the first light emitting portion EMA1 and the second light emitting portion EMA2 of the subpixel is improved.

Referring to FIG. 10, the bank layer 180 partitioning the pixel is located on the substrate 110 including the first electrode ANO, and the pixel defining portion 185 exposing the first electrode ANO is positioned on the substrate 110. The organic layer EML in contact with the first electrode ANO is located on the front surface of the substrate 110 and the second electrode CAT is located on the organic layer EML.

The organic light emitting display device according to the second embodiment of the present disclosure is significantly improved in aperture ratio compared to the first embodiment. Table 1 below shows the aperture ratios of the organic light emitting display devices according to the first and second embodiments by model.

TABLE 1

|  | First embodiment | Second embodiment |
|---|---|---|
| #1 55-inch UHD (80.6 ppi) | 24.4% | 29.3% |
| #2 55-inch FHD (40.3 ppi) | 29.8% | 31.6% |

Referring to Table 1, the aperture ratio of the organic light emitting display device according to the second embodiment of the present disclosure is improved by about 20% and 6%, compared to the first embodiment (with respect to 100%).

In the organic light emitting display device according to the second embodiment of the present disclosure, since the contact portion of the first electrode and the driving transistor is formed in the first repair portion through an extension line extending from the drain electrode of the driving transistor which is the capacitor upper electrode, the aperture ratio may be improved.

As described above, the organic light emitting display devices according to the embodiments of the present disclosure include the first and second repair portions, and thus, repairing may be performed when a subpixel malfunctions or is defective.

In addition, in the organic light emitting display devices according to the embodiments of the present disclosure, since the contact portion of the first electrode and the driving transistor is formed in the first repair portion through the extension line extending from the drain electrode of the driving transistor which is the capacitor upper electrode, the aperture ratio may be improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a plurality of subpixels on a substrate, each subpixel including a light emitting portion and a transmission portion including a first repair portion,
   wherein the light emitting portion includes a driving transistor and an organic light emitting diode connected to the driving transistor,
   an extension line connecting to the driving transistor, and
   a power supply line intersecting the extension line,
   wherein the extension line and a first electrode of the organic light emitting diode are connected to each other in the transmission portion.

2. The display device of claim 1, wherein the plurality of subpixels are defined where a gate line, a data line, a sensing line, a power supply line, and a cathode power supply line are located, and
   each of the plurality of subpixels further includes a switching transistor, a sensing transistor, and a capacitor.

3. The display device of claim 2, wherein the light emitting portion includes a first light emitting portion overlapping the driving transistor and a second light emitting portion overlapping the sensing transistor and the switching transistor.

4. The display device of claim 3, wherein the extension line intersects the data line across a portion between the first light emitting portion and the second light emitting portion.

5. The display device of claim 3, wherein the first electrode includes a first anode electrode located in the first light emitting portion and a second anode electrode located in the second light emitting portion.

6. The display device of claim 5, wherein the first anode electrode and the second anode electrode extend to the transmission portion to be integrally connected to each other, and the first anode electrode and the second anode electrode are connected to each other to form the first repair portion.

7. The display device of claim 5, wherein
   the extension line is in contact with the first anode electrode and the second anode electrode in the first repair portion.

8. The display device of claim 5, further comprising:
   a cathode contact portion in which the cathode power supply line and a second electrode of the organic light emitting diode overlap each other.

9. The display device of claim 1, wherein the extension line is formed of the same material as a source electrode of the driving transistor.

10. The display device of claim 1, wherein the extension line is located on the same layer as a source electrode of the driving transistor.

11. The display device of claim 3, wherein the extension line intersects the power supply line across a portion between the first light emitting portion and the second light emitting portion.

12. The display device of claim 1, further comprising:
   a passivation film located on the driving transistor and the extension line, and the passivation film exposing at least a portion of the extension line in the first repair portion; and
   a bank layer located on the first electrode and exposing at least a portion of the first electrode and the bank layer is in direct contact with the passivation film in the first repair portion.

13. A display device comprising:
a substrate including a light emitting portion and a transmission portion including a first repair portion;
a thin film transistor located on the substrate;
an extension line connecting to the thin film transistor;
a passivation film located on the thin film transistor and the extension line, and the passivation film exposing at least a portion of the extension line;
an overcoat layer located on the passivation layer, corresponding to the light emitting portion, and spaced apart from the first repair portion;
a first electrode located on the overcoat layer;
a bank layer located on the first electrode and exposing at least a portion of the first electrode;
a light emitting layer located on the exposed portion of the first electrode and the bank layer; and
a second electrode located on the light emitting layer,
wherein the first electrode and the extension line are in contact with each other through a contact hole formed in the passivation film in the first repair portion.

14. The display device of claim 13, wherein the first electrode includes a first anode electrode and a second anode electrode, the first repair portion is disposed in a region branched from the first anode electrode and the second anode electrode.

15. The display device of claim 14, wherein the extension line is electrically connected to the first anode electrode and the second anode electrode.

16. The display device of claim 13, wherein the extension line extends from a drain electrode to the first repair portion.

17. The display device of claim 13, wherein the extension line is formed of the same material as a drain electrode.

18. The display device of claim 13, wherein the extension line is located on the same layer as a drain electrode.

* * * * *